United States Patent
Ozawa et al.

(10) Patent No.: US 6,815,811 B2
(45) Date of Patent: Nov. 9, 2004

(54) SEMICONDUCTOR INTEGRATED CIRCUIT WITH DUMMY PATTERNS

(75) Inventors: Hiroyuki Ozawa, Kawasaki (JP); Hashimoto Kenji, Kawasaki (JP); Hideaki Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/994,753

(22) Filed: Nov. 28, 2001

(65) Prior Publication Data

US 2002/0063335 A1 May 30, 2002

(30) Foreign Application Priority Data

Nov. 30, 2000 (JP) .......................................... 2000-365985
Oct. 19, 2001 (JP) .......................................... 2001-322814

(51) Int. Cl.[7] .............................................. H01L 23/52
(52) U.S. Cl. .......................................... 257/691; 257/758
(58) Field of Search ................................ 257/691, 758, 257/664, 786

(56) References Cited

U.S. PATENT DOCUMENTS

| | | | |
|---|---|---|---|
| 5,032,890 A | * | 7/1991 | Ushiku et al. |
| 5,308,682 A | * | 5/1994 | Morikawa |
| 5,404,045 A | * | 4/1995 | Mizushima |
| 5,441,915 A | * | 8/1995 | Lee |
| 5,534,728 A | * | 7/1996 | Kim et al. |
| 5,589,706 A | * | 12/1996 | Mitwalsky et al. |
| 5,894,168 A | * | 4/1999 | Michael et al. |
| 6,020,616 A | * | 2/2000 | Bothra et al. |
| 6,069,067 A |   | 5/2000 | Kinugawa .................. 438/622 |
| 6,384,464 B1 | * | 5/2002 | Shin |
| 6,396,158 B1 | * | 5/2002 | Travis et al. |
| 6,399,897 B1 | * | 6/2002 | Umematsu et al. |

FOREIGN PATENT DOCUMENTS

JP          10-27799          1/1998

* cited by examiner

Primary Examiner—S. V. Clark
(74) Attorney, Agent, or Firm—Westerman, Hattori, Daniels & Adrian, LLP

(57) ABSTRACT

A semiconductor integrated circuit includes a plurality of layers provided on a semiconductor substrate, wires provided in a first layer that is one of the plurality of layers, and wire dummies provided in a second layer different from the first layer and having an arrangement that avoids areas overlapping positions of the wires.

12 Claims, 16 Drawing Sheets

NO DUMMY IN $N^{TH}$ LAYER OVER AND UNDER WIRES OF $N+1^{TH}$ LAYER AND WIRES OF $N-1^{TH}$ LAYER

FIG. 5

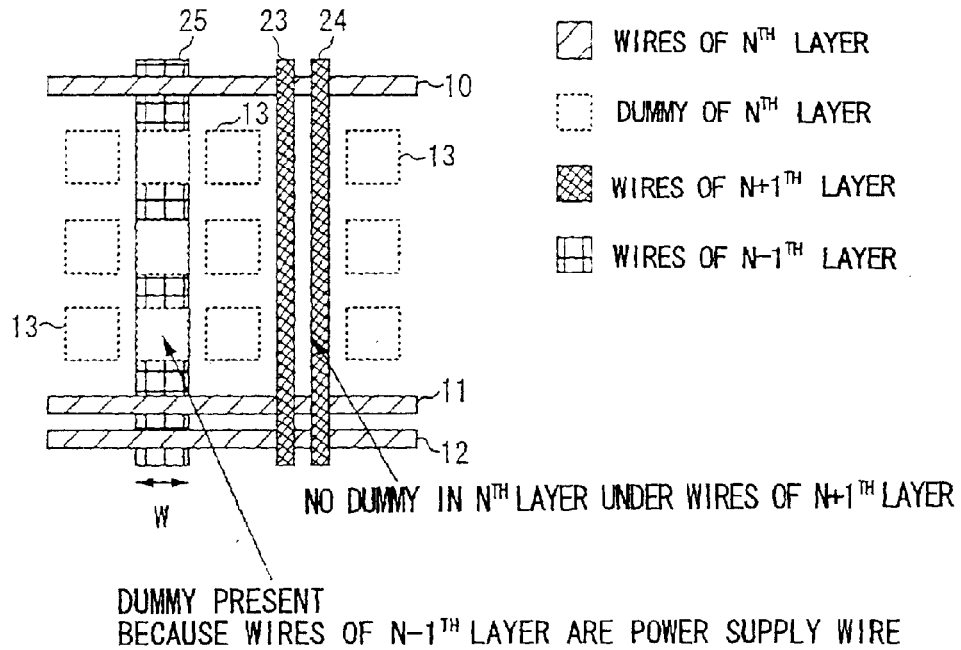

- ▨ WIRES OF N$^{TH}$ LAYER
- ▢ DUMMY OF N$^{TH}$ LAYER
- ▩ WIRES OF N+1$^{TH}$ LAYER
- ⊞ WIRES OF N-1$^{TH}$ LAYER

NO DUMMY IN N$^{TH}$ LAYER UNDER WIRES OF N+1$^{TH}$ LAYER

DUMMY PRESENT BECAUSE WIRES OF N-1$^{TH}$ LAYER ARE POWER SUPPLY WIRE

FIG. 6

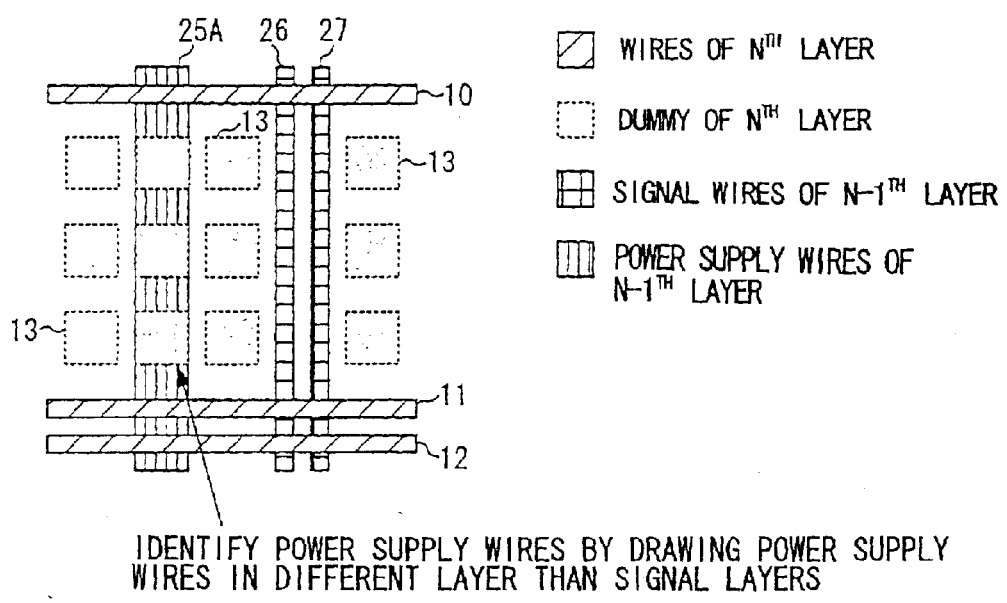

- ▨ WIRES OF N$^{TH}$ LAYER
- ▢ DUMMY OF N$^{TH}$ LAYER
- ⊞ SIGNAL WIRES OF N-1$^{TH}$ LAYER
- ⦀ POWER SUPPLY WIRES OF N-1$^{TH}$ LAYER

IDENTIFY POWER SUPPLY WIRES BY DRAWING POWER SUPPLY WIRES IN DIFFERENT LAYER THAN SIGNAL LAYERS

- ▨ WIRES OF N$^{TH}$ LAYER
- ⬚ DUMMY OF N$^{TH}$ LAYER
- ▩ WIRES OF N+1$^{TH}$ LAYER
- ≡ POLYSILICON OR DIFFUSION LAYER (N−1$^{TH}$ LAYER)

NO DUMMY OVER POLYSILICON

- ▨ WIRES OF N$^{TH}$ LAYER
- ⬚ DUMMY OF N$^{TH}$ LAYER
- ▩ WIRES OF N+1$^{TH}$ LAYER
- ▦ WIRES OF N+M$^{TH}$ LAYER (M IS POSITIVE INTEGER)
- ⊞ WIRES OF N−1$^{TH}$ LAYER

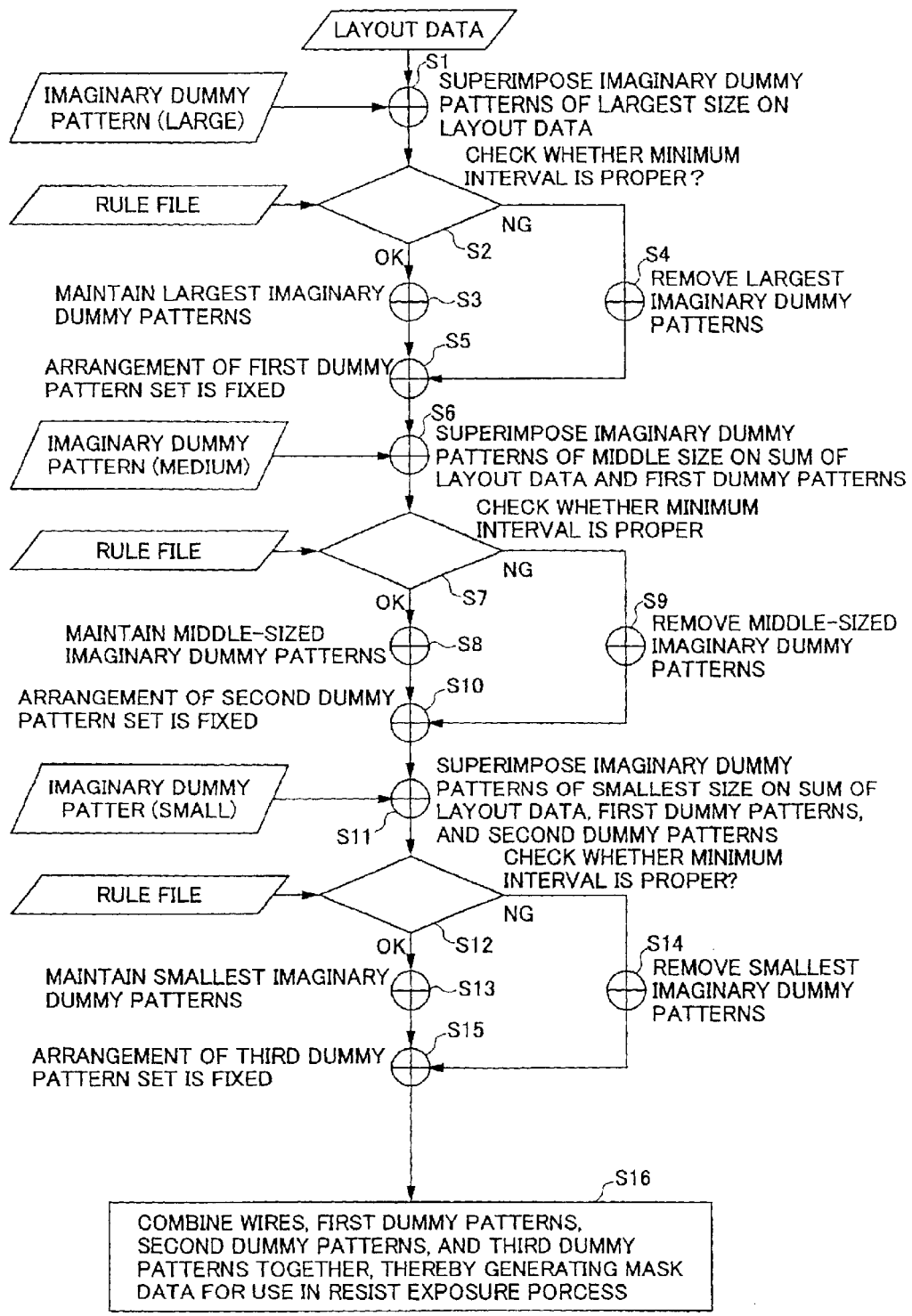

INITIAL WIRES

FIRST PROCESS

SECOND PROCESS

THIRD PROCESS

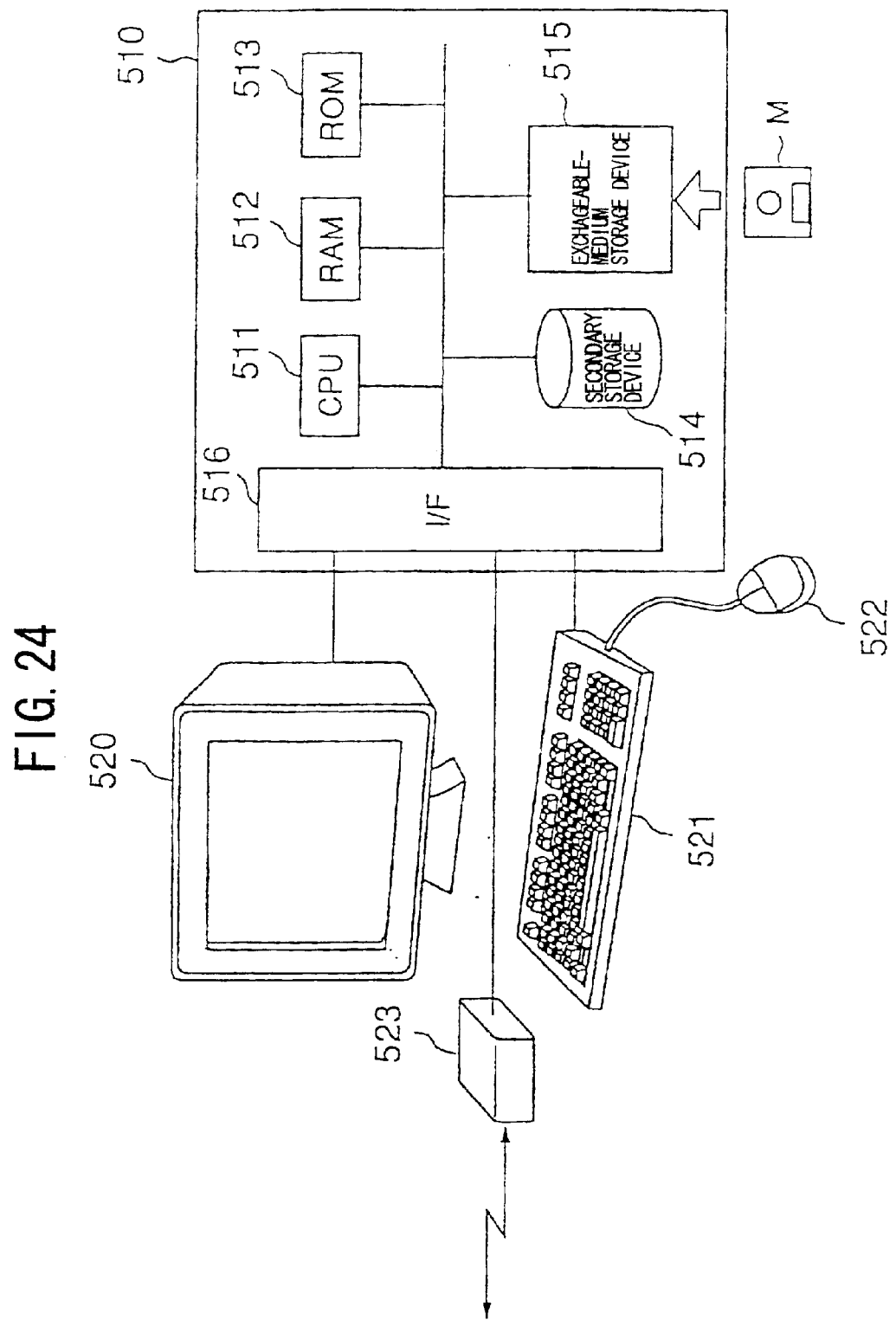

SEMICONDUCTOR INTEGRATED CIRCUIT WITH DUMMY PATTERNS

BACKGROUND OF THE INVENTION

1. Field of the Invention

The present invention generally relates to semiconductor integrated circuits, and particularly relates to a semiconductor integrated circuit having dummy patterns.

2. Description of the Related Art

When a semiconductor integrated circuit of a large scale is to be manufactured, the density of circuit wires may vary from position to position on the substrate. If this happens, optimum etching conditions vary depending on the positions, so that the etching processing will have varying effects. At the positions where the wire density is small, a resist pattern may disappear, resulting in a severance of a wire, or resulting in a thinning of the wire width that will dramatically increase the wire resistance. If the thinning of the wire is significant, the wire may fall down as a result of such thinning. In order to avoid these defectives, semiconductor integrated circuits of today have wire dummies arranged at positions of small wire densities, thereby insuring a constant wire density allover the substrate.

FIG. 1 is a plan view showing a portion of a semiconductor integrated circuit having a constant wire density created by wire dummies.

FIG. 1 shows a plan view of wires provided at the $n^{th}$ layer on a semiconductor substrate. Wires 10 through 12 of the $n^{th}$ layer are arranged as circuit wires (n is a positive integer). There is no circuit wire between the wires 10 and 11, so that the severance or thinning of wires may develop if the semiconductor integrated circuit is manufactured by etching processes without taking any counter measures. In order to avoid this, as shown in FIG. 1, a circuit is designed such that wire dummies 13 are arranged in the blank area between the wires of the $n^{th}$ layer. These wire dummies 13 are not electrically connected to the circuit, but are provided merely for the purpose of achieving a constant wire density and constant etching conditions.

The arrangement of the wire dummies 13 makes it possible to avoid the severance and thinning of wires caused by varying etching conditions.

The wire dummies 13 do not have any direct electrical connection with the real circuitry, but create undesirable capacitance.

FIG. 2 is a drawing for explaining the generation of capacitance by the wire dummies 13.

As shown in FIG. 2, the $n+1^{th}$ layer atop the $n^{th}$ layer has wires 14 and 15 arranges as part of the real circuitry, and the $n-1^{th}$ layer beneath the $n^{th}$ layer has wires 16 and 17 arranged as part of the real circuitry. Capacitance comes into existence between the wires 14 through 17 and the wire dummies 13.

FIG. 3 is a drawing for explaining the effect of capacitance by the wire dummies 13.

On the left-hand side in FIG. 3, a cross-sectional view taken along the line A—A' in FIG. 2 is shown. On the right-hand side in FIG. 3, a illustrative drawing is shown to demonstrate a coupling capacitance that develops at a position encircled by a dotted circle in the cross-sectional view. As shown in these illustrations, capacitances C1 and C2 are generated between the wires 14 and 15 and a wire dummy 13. When a circuit simulation is conducted as part of the circuit designing process, wires of the real circuitry can be incorporated into the simulation by identifying the capacitance between the wire. The wire dummies 13, however, are automatically generated after the circuit designing process. Because of this, the capacitances C1 and C2 between the wires and the wire dummy 13 cannot be identified and incorporated into the simulation. As a result, these capacitances surface as simulation errors, thereby degrading the accuracy of simulation analysis.

In the method of generating related-art wire dummy patterns, unit dummy patterns each having a constant size and a constant shape are arranged at predetermined intervals to fill a blank area where no wires are present. According to this method, however, no dummy pattern is inserted at areas where the interval between wires is smaller than the size of the dummy pattern. If the interval between wires is wider, a single row of dummy patterns may be inserted. Even when the wire interval is further widened, however, only a single row of dummy patterns may be arranged if the wire interval is not sufficient to accommodate the second row of dummy patterns while keeping the predetermined interval with the first row. In this manner, if the dummy patterns having the predetermined size are to be arranged at the predetermined intervals, the arrangement of dummy patterns exhibits stepped, discreet changes whereas the wire interval exhibits a gradual, continuous change. Because of this, a blank area is likely to be generated, resulting in a failure to increase the area of resist patterns and a failure to achieve a constant area ratio for the resist patterns.

Accordingly, there is a need for a semiconductor integrated circuit which has a reduced capacitance between wires of the real circuitry and wire dummies, thereby improving the accuracy of simulation analysis.

Further, there is a need for a semiconductor integrated circuit which has dummy patterns arranged therein such as to increase the area ratio of resist patterns and to make the area ratio constant regardless of the length of wire intervals.

SUMMARY OF THE INVENTION

It is a general object of the present invention to provide a semiconductor integrated circuit that substantially obviates one or more of the problems caused by the limitations and disadvantages of the related art.

It is another and more specific object of the present invention to provide a semiconductor integrated circuit which has a reduced capacitance between wires of the real circuitry and wire dummies, thereby improving the accuracy of simulation analysis.

It is yet another object of the present invention to provide a semiconductor integrated circuit which has dummy patterns arranged therein such as to increase the area ratio of resist patterns and to make the area ratio constant regardless of the length of wire intervals.

In order to achieve the above objects according to the present invention, a semiconductor integrated circuit includes a plurality of layers provided on a semiconductor substrate, wires provided in a first layer that is one of the plurality of layers, and wire dummies provided in a second layer different from the first layer and having an arrangement that avoids areas overlapping positions of the wires.

With this provision, it is possible to reduce capacitance between circuit wires and wire dummies provided in different layers, thereby improving the accuracy of simulation at the time of circuit design. Further, parasitic capacitance associated with wires can be reduced in actual devices, so that signal delays along the wires can be reduced.

According to another aspect of the present invention, the semiconductor integrated circuit as described above is such that the wires are signal wires excluding power supply wires. Further, the wire dummies are further provided in areas overlapping positions of the power supply wires that are provided in the first layer.

In this configuration, restrictions prohibiting the generation of wire dummies are not imposed with respect to power supply wires that are not affected by coupling capacitance. This avoids a situation in which the wire dummies are significantly reduced in number due to the presence of circuit wires in layers situated on or beneath the layer of concern, and avoids the undermining of an objective that is to achieve a constant wire density by use of the wire dummies.

According to another aspect of the present invention, the semiconductor integrated circuit as described above is such that the wire dummies have the arrangement that further avoids areas overlapping positions of polysilicon or diffusion layers.

With this provision, it is possible to reduce capacitance between wire dummies and polysilicon or diffusion layers that are susceptible to coupling capacitance, thereby improving the accuracy of simulation at the time of circuit design. Further, parasitic capacitance associated with wires can be reduced in actual devices, so that signal delays along the wires can be reduced.

According to another aspect of the present invention, a semiconductor integrated circuit includes a wire layer, wires provided in the wire layer, and dummy patterns provided in the wire layer and having different sizes.

In this configuration, use of the plurality of dummy pattern sizes makes it possible to generate small-sized dummy patterns in areas where no dummy pattern could be generated in the related art, thereby increasing the area ratio of resist patterns and making the area ratio constant regardless of the length of wire intervals.

According to another aspect of the present invention, a semiconductor integrated circuit includes a wire layer, wires provided in the wire layer, and dummy patterns provided in the wire layer and having different shapes conforming to patterns of the wires.

With this provision, use of dummy patterns having different shapes conforming to patterns of wires makes it possible to generate dummy patterns in areas where no dummy pattern could be generated in the related art, thereby increasing the area ratio of resist patterns and making the area ratio constant regardless of the length of wire intervals.

According to another aspect of the present invention, a semiconductor integrated circuit includes a plurality of wire layers stacked one over another, a plurality of wires including first wires and second wires and arranged in a first wire layer that is one of the wire layers, the plurality of wires being arranged at various intervals, a shortest of which is a predetermined interval, the first wires having wires on both sides thereof at a distance equal to the predetermined interval, and the second wires having no wires on both sides thereof at a distance equal to the predetermined interval, and dummy patterns provided in a second wire layer immediately above or below the first wire layer, the dummy patterns being arranged in areas overlapping positions of the first wires and being absent in areas overlapping positions of the second wires.

In the semiconductor integrated circuit described above, no dummy pattern is provided in the layers above and below the wires that have adjacent grids vacant on both sides thereof since dummy patterns for such wires have relatively large parasitic capacitance. Here, grids are an imaginary structure of grids arranged at intervals that correspond to a minimum space between the wires. Further, dummy patterns are provided in the layers above and below the wires that have adjacent grids filled on both sides thereof since dummy patterns for such wires have relatively small parasitic capacitance.

According to another aspect of the present invention, a semiconductor integrated circuit includes a plurality of wire layers stacked one over another, a plurality of wires including first wires, second wires, and third wires, and arranged in a first wire layer that is one of the wire layers, the first wires being narrower than a predetermined width, the second wires being equal to or wider than the predetermined width and carrying a power supply potential, and the third wires being equal to or wider than the predetermined width and carrying a clock signal, and dummy patterns provided in a second wire layer immediately above or below the first wire layer, the dummy patterns being arranged in areas overlapping positions of the second wires and being absent in areas overlapping positions of the third wires.

In the semiconductor integrated circuit as described above, dummy patterns are present in layers above and below with respect to wide-width wires that are power supply wires, whereas dummy patterns are absent in layers above and below with respect to wide-width wires that are clock wires carrying varying signal levels. This provision makes it possible to arrange dummy patterns while taking into account the presence of wide-width wires that carry varying signal levels.

A method of arranging dummy patterns according to the present invention includes the steps of providing sets of dummy patterns, each of the sets including patterns of a corresponding size arranged in rows and columns, and arranging the sets of dummy patterns in a descending order of size on a wire layout.

Further, a method of arranging dummy patterns according to the present invention includes the steps of providing dummy patterns arranged at varying intervals inclusive of first intervals and second intervals that are longer than the first intervals, arranging the dummy patterns on a wire layout, combining the dummy patterns spaced at the first intervals by expanding size of the dummy patterns, and shrinking the size of the combined dummy patterns.

Moreover, a method of arranging dummy patterns according to the present invention includes expanding width of first wire patterns arranged in a first wire layer at various intervals, a shortest of which is a predetermined interval, so as to combine the first wire patterns spaced at the predetermined interval, shrinking width of the expanded wire patterns including the combined wire patterns, generating second wire patterns by superimposing the shrunk wire patterns on the first wire patterns, and arranging dummy patterns in a second layer immediately above or below the first layer while avoiding areas overlapping positions of the second wire patterns, except for positions of the shrunk wire patterns.

Other objects and further features of the present invention will be apparent from the following detailed description when read in conjunction with the accompanying drawings.

BRIEF DESCRIPTION OF THE DRAWINGS

FIG. 5 is a drawing showing a portion of a semiconductor integrated circuit according to a second embodiment of the present invention;

FIG. 6 is a drawing showing a portion of a semiconductor integrated circuit according to a third embodiment of the present invention;

FIG. 11 is a flowchart of a method of arranging dummy patterns according to the sixth embodiment of the present invention;

FIG. 24 is a CAD system that performs the method of arranging dummy patterns according to the present invention.

DESCRIPTION OF THE PREFERRED EMBODIMENTS

In the following, embodiments of the present invention will be described with reference to the accompanying drawings.

Figure 1:
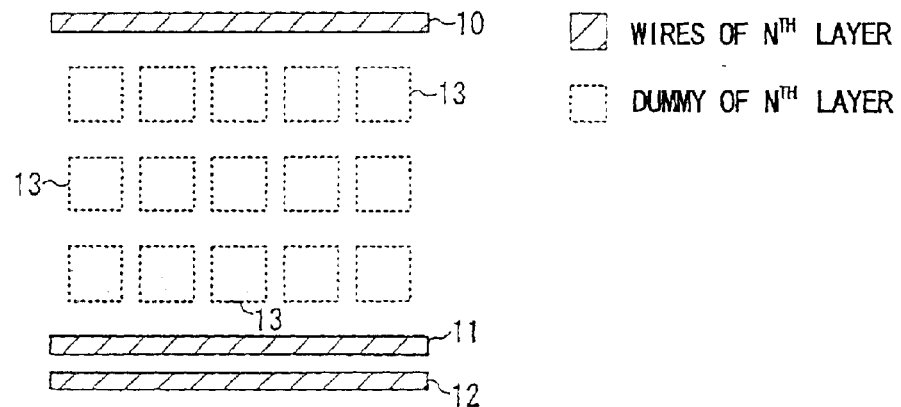
FIG. 1 is a plan view showing a portion of a semiconductor integrated circuit having a constant wire density created by wire dummies.
Figure 2:
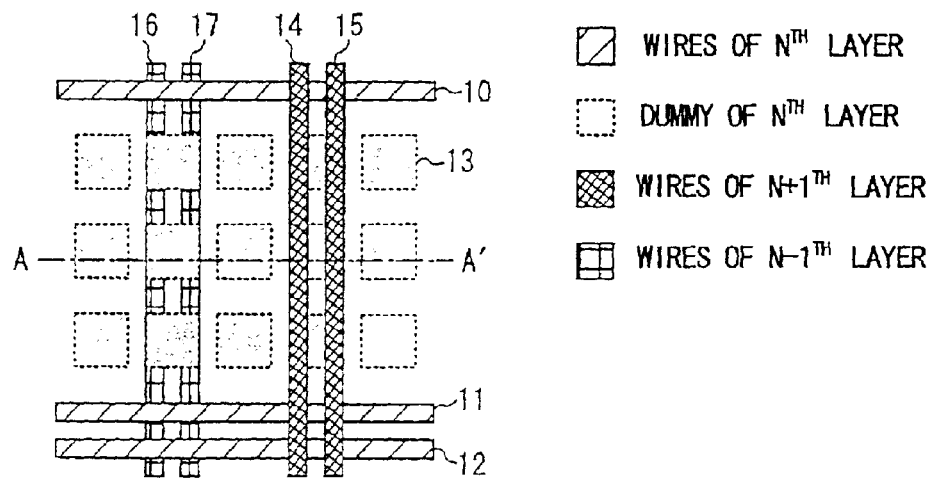
FIG. 2 is a drawing for explaining the generation of capacitance by the wire dummies.
Figure 3:
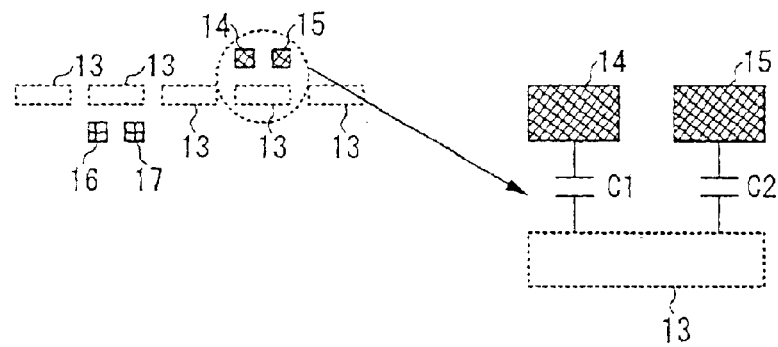
FIG. 3 is a drawing for explaining the effect of capacitance by the wire dummies.
Figure 4:
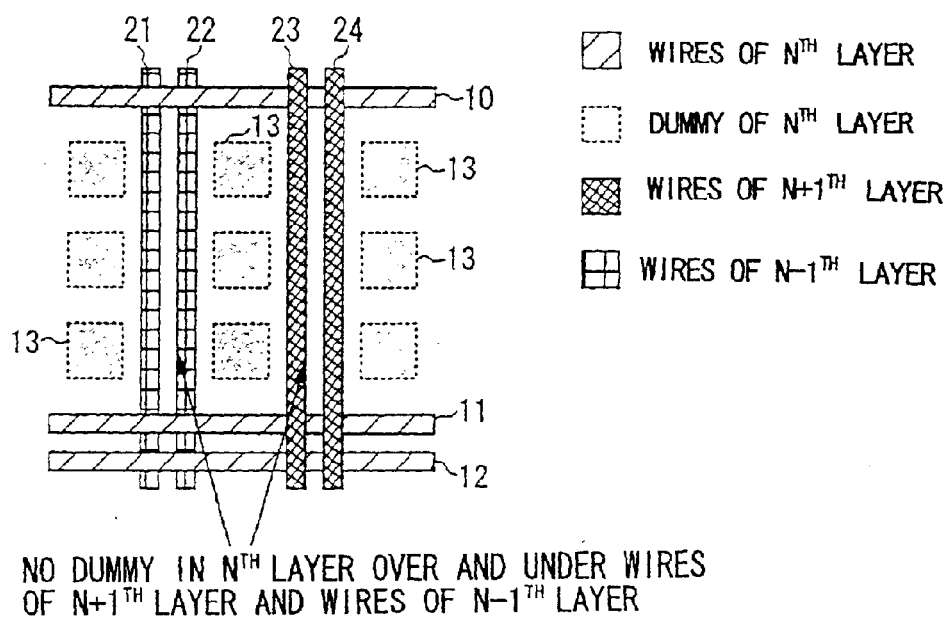
FIG. 4 is a drawing showing a portion of a semiconductor integrated circuit according to a first embodiment of the present invention.

FIG. 4 is a drawing showing a portion of a semiconductor integrated circuit according to a first embodiment of the present invention.

FIG. 4 shows a plan view of wires of the $n-1^{th}$ layer through the $n+1^{th}$ layer on a semiconductor substrate. The wires 10 through 12 of the $n^{th}$ layer are arranged as circuit wires. There is no circuit wire between the wires 10 and 11, so that the wire dummies 13 are arranged in the same $n^{th}$ layer in the blank area between the wires of the $n^{th}$ layer. These wire dummies 13 are not electrically connected to the circuit, but are provided merely for the purpose of achieving a constant wire density and constant etching conditions.

When the wire dummies 13 are to be arranged, provision is made to refrain from arranging the wire dummies 13 in areas that overlap circuit wires arranged in the $n+1^{th}$ layer and/or the $n-1^{th}$ layer stacked on or beneath the $n^{th}$ layer. In an example of FIG. 4, wires 21 and 22 of the real circuit are arranged in the $n-1^{th}$ layer, so that the wire dummies 13 are not provided at the $n^{th}$ layer in areas that overlap these wires 21 and 22. By the same token, wires 23 and 24 of the real circuit are arranged in the $n+1^{th}$ layer, so that the wire dummies 13 are not provided at the $n^{th}$ layer in areas that overlap these wires 23 and 24.

In this manner, capacitance between the circuit wires of the $n+1^{th}$ layer and/or the $n-1^{th}$ layer and the wire dummies 13 of the $n^{th}$ layer can be reduced, thereby improving the accuracy of simulation at the time of circuit designing. Further, the parasitic capacitance of wires can be reduced in real devices, thereby reducing signal delays along the wires.

FIG. 5 is a drawing showing a portion of a semiconductor integrated circuit according to a second embodiment of the present invention.

FIG. 5 shows a plan view of wires of the $n-1^{th}$ layer through the $n+1^{th}$ layer on a semiconductor substrate. In FIG. 5, the same elements as those of FIG. 4 are referred to by the same numerals.

There is no circuit wire between the wires 10 and 11, so that the wire dummies 13 are arranged in the same $n^{th}$ layer in the blank area between the wires. When the wire dummies 13 are to be arranged, provision is made to refrain from arranging the wire dummies 13 in areas that overlap circuit wires arranged in the $n+1^{th}$ layer and/or the $n-1^{th}$ layer stacked on or beneath the $n^{th}$ layer. In an example of FIG. 5, the wires 23 and 24 of the real circuit are arranged in the $n+1^{th}$ layer, so that the wire dummies 13 are not provided at the $n^{th}$ layer in areas that overlap these wires 23 and 24.

As an exception, if the wires of real circuitry arranged in the $n+1^{th}$ layer and/or the $n-1^{th}$ layer are the wires for power supply, the wire dummies 13 are arranged in areas that overlap the wires for power supply. In the example of FIG. 5, a wire 25 of real circuitry is arranged in the $n-1^{th}$ layer. Since the wire 25 is a wire for power supply, the wire dummies 13 are provided at the $n^{th}$ layer in areas that overlap the wire for power supply.

A voltage supplied to the wires for power supply is not a signal voltage but a power supply voltage, so that capacitance generated by the wire dummies 13 does not pose any problem. Accordingly, no restriction is imposed when arranging the wire dummies 13 with respect to wires for power supply. This avoids a situation in which the wire dummies 13 are significantly reduced in number due to the presence of circuit wires in layers situated on or beneath the layer of concern, and avoids the undermining of an objective that is to achieve a constant wire density by use of the wire dummies 13.

In order to discriminate power supply wires from other wires, the width of wires may be checked. Power supply wires are tend to be designed to have a wider width W, compared with signal wires for signal transfer. When the width W of wires is wider than a predetermined width, therefore, these wires are identified as power supply wires, and the restriction prohibiting the arrangement of wire dummies 13 may be lifted. The wire width threshold for discriminating signal wires from power supply wires varies depending on the fineness of semiconductor integrated circuits, and will become smaller as the semiconductor manufacturing process develops technologically. Thus, the wire width threshold cannot be defined with a definite fixed value. In detail, the wire width threshold may be changed according to the degree of fineness of semiconductor integrated circuits.

FIG. 6 is a drawing showing a portion of a semiconductor integrated circuit according to a third embodiment of the present invention.

FIG. 6 shows a plan view of wires of the n-1$^{th}$ layer through the n+1$^{th}$ layer on a semiconductor substrate. In FIG. 6, the same elements as those of FIG. 5 are referred to by the same numerals.

In the third embodiment shown in FIG. 6, a circuit is designed in the same manner as in the second embodiment shown in FIG. 5. That is, if the wires of real circuitry arranged in the n+1$^{th}$ layer and/or the n-1$^{th}$ layer are the wires for power supply, the wire dummies 13 are arranged in areas that overlap the wires for power supply. In the second embodiment of FIG. 5, the wire width W is checked in order to identify the wire 25 of the n-1$^{th}$ layer as a power supply wire. In the third embodiment of FIG. 6, on the other hand, a wire layout is created during a wire layout designing process in such a manner that a power supply wire 25A is drawn in a different layer than wires 26 and 27 of the n-1$^{th}$ layer. For example, a layer n-1'$^{th}$ layer different from the n-1$^{th}$ layer is provided at the time of wire layout designing, and all power supply wires are laid out in this n-1'$^{th}$ layer. This makes the wire 25A of FIG. 6 readily recognizable as a power supply wire.

Figure 7:
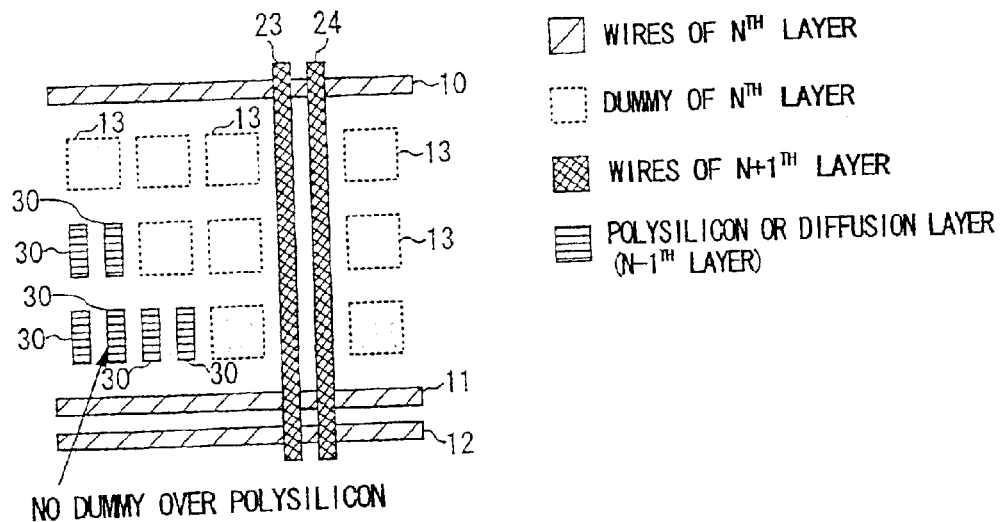
FIG. 7 is a drawing showing a portion of a semiconductor integrated circuit according to a fourth embodiment of the present invention.

FIG. 7 is a drawing showing a portion of a semiconductor integrated circuit according to a fourth embodiment of the present invention.

FIG. 7 shows a plan view of wires of the n-1$^{th}$ layer through the n+1$^{th}$ layer on a semiconductor substrate. In FIG. 7, the same elements as those of FIG. 4 are referred to by the same numerals. As shown in FIG. 7, the wires 10 through 12 of the n$^{th}$ layer are arranged as circuit wires. There is no circuit wire between the wires 10 and 11, so that the wire dummies 13 are arranged in the same n$^{th}$ layer in the blank area between the wires.

When the wire dummies 13 are to be arranged, provision is made to refrain from arranging the wire dummies 13 in areas that overlap polysilicon layers or diffusion layers formed on the semiconductor substrate in the layers provided on or beneath the n$^{th}$ layer. In an example of FIG. 7, polysilicon or diffusion layers 30 are provided in the n-1$^{th}$ layer, so that the wire dummies 13 are not arranged at the n$^{th}$ layer in areas that overlap the polysilicon or diffusion layers 30.

In this manner, capacitance between the polysilicon or diffusion layers of the n-1$^{th}$ layer and the wire dummies 13 of the n$^{th}$ layer can be reduced, thereby improving the accuracy of simulation at the time of circuit designing. Further, the parasitic capacitance of wires can be reduced in real devices, thereby reducing signal delays along the wires.

Figure 8:
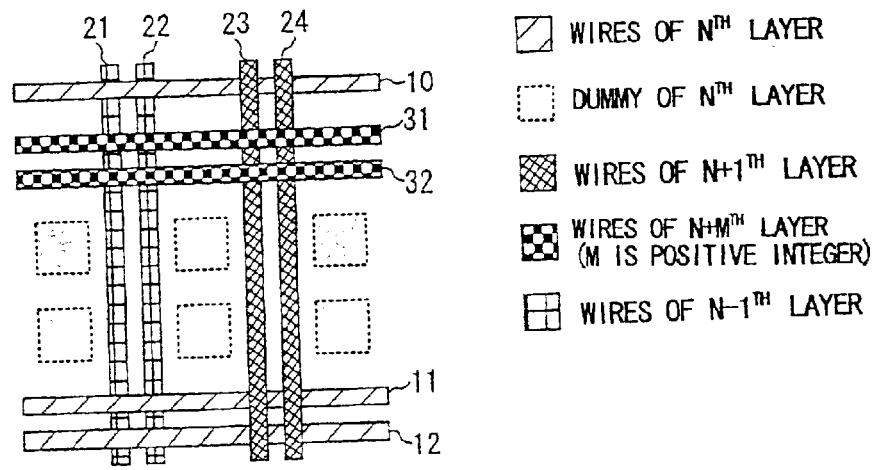
FIG. 8 is a drawing showing a portion of a semiconductor integrated circuit according to a fifth embodiment of the present invention.

FIG. 8 is a drawing showing a portion of a semiconductor integrated circuit according to a fifth embodiment of the present invention.

FIG. 8 shows a plan view of wires of a plurality of layers on a semiconductor substrate, and the same elements as those of FIG. 4 are referred to by the same numerals.

The wires 10 through 12 of the n$^{th}$ layer are arranged as circuit wires. There is no circuit wire between the wires 10 and 11, so that the wire dummies 13 are arranged in the same n$^{th}$ layer in the blank area between the wires of the n$^{th}$ layer. Since the wires 21 and 22 of real circuitry are arranged in the n-1$^{th}$ layer, the wire dummies 13 are not provided at the n$^{th}$ layer in areas that overlap these wires 21 and 22. By the same token, the wires 23 and 24 of real circuitry are arranged in the n+1$^{th}$ layer, so that the wire dummies 13 are not provided at the n$^{th}$ layer in areas that overlap these wires 23 and 24.

In the fifth embodiment, further, when the wire dummies 13 are to be arranged, provision is made to refrain from arranging the wire dummies 13 at the n$^{th}$ layer in areas that overlap circuit wires arranged in the n+m$^{th}$ layer and/or the n-m$^{th}$ layer stacked above or below the n$^{th}$ layer (m is a positive integer). In the example of FIG. 8, wires 31 and 32 of real circuitry are arranged in the n-m$^{th}$ layer, so that the wire dummies 13 are not provided at the n$^{th}$ layer in areas that overlap these wires 31 and 32.

In this manner, capacitance between the circuit wires of the n-m$^{th}$ through n+m$^{th}$ layers and the wire dummies 13 of the n$^{th}$ layer can be reduced, thereby improving the accuracy of simulation at the time of circuit designing. In the fifth embodiment, the wire dummies 13 are not provided in areas that overlap circuit wires arranged in any one of the n-m$^{th}$ layer through the n+m$^{th}$ layer. In addition, provision may be made such as to refrain from arranging the wire dummies 13 in areas that overlap polysilicon or diffusion layers as in the fourth embodiment.

In the following, further embodiments of the present invention will be described with reference to the accompanying drawings.

In the following, an embodiment will be described by taking a single layer as an example among a plurality of layers of an LSI device. When there is a need to take into consideration more than one layer, this single layer and adjacent layers situated above and below the single layer will be used as an example.

Figures 9A, 9B, 9C:
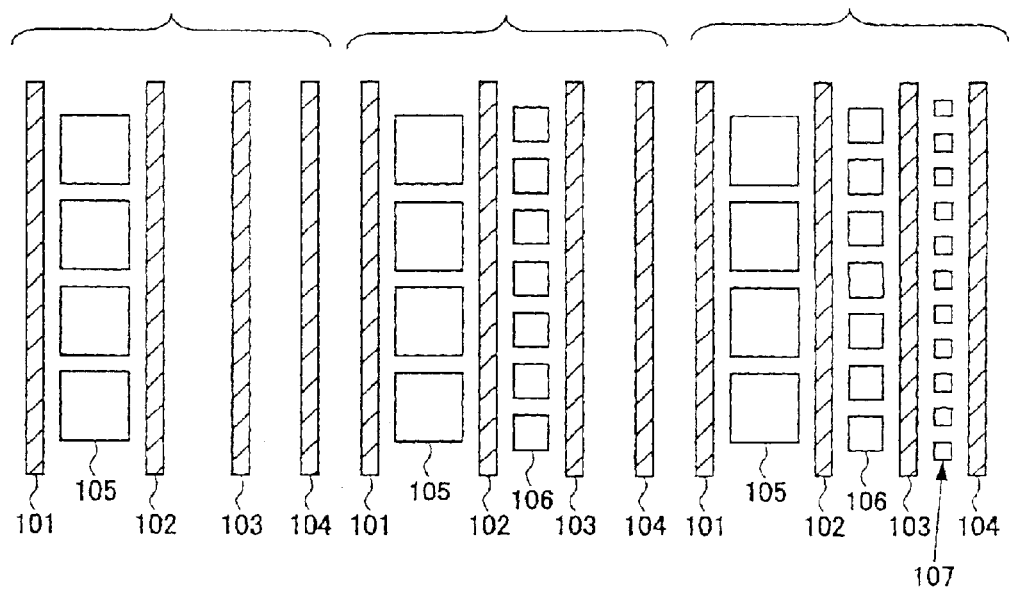
FIGS. 9A through 9C are plan views of a wire layout for explaining a method of arranging dummy patterns and a semiconductor integrated circuit according to a sixth embodiment of the present invention.

FIGS. 9A through 9C are plan views of a wire layout for explaining a method of arranging dummy patterns and a semiconductor integrated circuit according to a sixth embodiment of the present invention. The wire layout of FIGS. 9A through 9C includes a first wire 101, a second wire 102, a third wire 103, and a fourth wire 104. The wires 101 through 104 are situated in the same layer.

As shown in FIG. 9A, first dummy patterns 105 are generated at a first step. The dummy patterns 105 are of the largest size among the three dummy patterns having different sizes used in the sixth embodiment. The size of the dummy patterns 105 is 9 μm, for example, and the interval between the adjacent dummy patterns 105 is 1 μm, for example. In this case, the occupancy ratio of wires in an area where the dummy patterns 105 are arranged in rows and columns will be 81% (=(9*9)/((9+1)*(9+1))*100), thereby achieving a high occupancy ratio. Since the dummy pattern 105 is that of the largest size, the dummy patterns 105 are generated only in areas of wide wire intervals as in the area between the wire 101 and the wire 102.

FIG. 9B shows the generation of dummy patterns at a second step. Dummy patterns 106 are of the middle size among the three dummy patterns having different sizes used in the sixth embodiment. The size of the dummy patterns 106 is 2 μm, for example, and the interval between the adjacent dummy patterns 106 is 1 μm, for example. In this case, the occupancy ratio of wires in an area where the dummy patterns 106 are arranged in rows and columns will be 45% (=(2*2)/((2+1)*(2+1))*100). Since the dummy patterns 105 have already been arranged, the dummy patterns 106 are not generated between the wire 101 and the wire 102. Since the interval between the wire 103 and the wire 104 is too narrow, the dummy patterns 106 are not generated between the wire 103 and the wire 104.

FIG. 9C shows the generation of dummy patterns at a third step. Dummy patterns 107 are of the smallest size among the three dummy patterns having different sizes used in the sixth embodiment. The size of the dummy patterns 107 is 1 μm, for example, and the interval between the adjacent dummy patterns 107 is 1 μm, for example. In this case, the occupancy ratio of wires in an area where the dummy patterns 107 are arranged in rows and columns will be 25% (=(1*1)/((1+1)*(1+1))*100).

Since the dummy patterns 105 and 106 have already been arranged, the dummy patterns 107 are not generated between the wire 101 and the wire 102 and between the wire 102 and the wire 103.

In this embodiment as described above, a plurality of dummy patterns having different sizes are provided, and are arranged successively in the descending order of size at spatial intervals according to the pattern size. In this embodiment, the size of dummy patterns having the smallest size may be reduced without any regard to the area occupancy ratio of wires. This can be explained as follows.

In the related-art method which uses dummy patterns of a single size, it is assumed for the sake of argument that the dummy size is 2 μm, and that the dummy pattern interval is 1 μm. Such dummy patterns are the same as the dummy patterns 106 used in the sixth embodiment. When this dummy pattern is used, the area occupancy ratio of the dummy patterns is 45%, thereby achieving a proper resist area ratio. It should be noted that the resist area ratio is regarded as appropriate if it falls within the range substantially between 30% and 80%.

Figure 10:
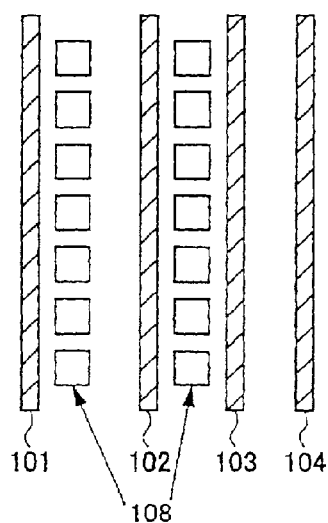
FIG. 10 shows a case in which the related-art dummy patterns are applied to wires used in the sixth embodiment.

FIG. 10 shows a case in which the related-art dummy patterns as described above are applied to the wires 101 through 104 used in the sixth embodiment. Dummy patterns 108 are generated between the wire 101 and the wire 102 and between the wire 102 and the wire 103, but are not generated between the wire 103 and the wire 104.

If only dummy patterns are taken into account in calculating the area occupancy ratio, the area occupancy ratio is 45% between the wire 101 and the wire 102 and between the wire 102 and the wire 103, and is 0% between the wire 103 and the wire 104. If the wires 101 through 103 are also taken into account in calculating the area occupancy ratio, a significant tract of blank areas exists between the dummy patterns 108 and the wire 102 in the proximity of the wires 101 and 102, so that the area occupancy ratio is significantly lower than 45% in reality.

In the case of FIG. 9C according to the sixth embodiment of the present invention, if only the dummy patterns are taken into account in calculating the area occupancy ratio, the area occupancy ratio is 81% between the wire 101 and the wire 102, 45% between the wire 102 and the wire 103, and 25% between the wire 103 and the wire 104. Use of a plurality of dummy pattern sizes in this manner makes it possible to increase the area occupancy ratio. If the wires 101 through 103 are also taken into account in calculating the area occupancy ratio, the area occupancy ratio in reality is less than 81% in the proximity of the wires 101 and 102, and is more than 25% in the proximity of the wires 103 and 104. Accordingly, the area occupancy ratio can be increased all across the areas, and, also, a proper area occupancy ratio can be achieved. In this embodiment, further, dummy patterns are successively arranged in the descending order of dummy pattern size, so that dummy patterns having large size are inserted into areas of wide wire intervals, thereby increasing the area occupancy ratio at their localities. If dummy patterns are arranged in the ascending order of dummy pattern size, the dummy pattern of the smallest size will occupy all the areas between the wires 101, 102, 103, and 104. Because of this, there is no space for larger dummy patterns, thereby failing to improve the area occupancy ratio. It should be noted, however, that even if the dummy patterns are successively arranged in the ascending order of dummy pattern size, proper arrangement of dummy patterns may be attained by making it sure to leave areas for larger dummy patterns when arranging smaller dummy patterns.

In this embodiment, use of the plurality of dummy pattern sizes makes it possible to use dummy patterns smaller than the single-sized dummy patterns used in the related art. Use of such small size dummy patterns makes it possible to generate dummy patterns in areas such as between the wire 103 and the wire 104 where no dummy pattern could be generated in the related art as shown in FIG. 10.

The intervals of dummy patterns cannot be reduced in proportion to the size of dummy patterns due to design rule constraints, and are bounded by a certain lower limit. If the size of the single-sized dummy patterns of the related art is selected such as to provide dummy patterns between the wire 103 and the wire 104, it is not possible to maintain a proper area occupancy ratio in the areas of wider wire intervals such as between the wire 101 and the wire 102. In the present embodiment, on the other hand, dummy patterns matching the wire intervals in size are used as shown in FIG. 9C, so that the dummy patterns 107 usable for areas of narrow wire intervals can be used while maintaining a proper area occupancy ratio.

FIG. 11 is a flowchart of a method of arranging dummy patterns according to the sixth embodiment of the present invention.

At step S1, data of imaginary dummy patterns of the largest size and data of layouts are retrieved, and the imaginary dummy patterns of the largest size are superimposed on the layout data. At step S2, a rule file is retrieved, and a check is made as to whether the minimum interval between each of the largest imaginary dummy patterns and wires is proper. If it is proper, the largest imaginary dummy patterns remain at step S3. If there are imaginary dummy patterns that are not proper, the largest imaginary dummy patterns that are not proper are selected and removed at step S4. After these steps, the arrangement of the first dummy pattern set is fixed at step S5.

At step S6, data of imaginary dummy patterns of the middle size is retrieved, and the imaginary dummy patterns of the middle size are superimposed on the sum of the layout data and the first dummy patterns. At step S7, a rule file is retrieved, and a check is made as to whether the minimum interval between each of the middle-sized imaginary dummy patterns and either one of wires and first dummy patterns is proper. If it is proper, the middle-sized imaginary dummy patterns remain at step S8. If there are imaginary dummy patterns that are not proper, the middle-sized imaginary dummy patterns that are not proper are selected and removed at step S9. After these steps, the arrangement of the second dummy pattern set is fixed at step S10.

At step S11, data of imaginary dummy patterns of the smallest size is retrieved, and the imaginary dummy patterns of the smallest size are superimposed on the sum of the layout data, the first dummy patterns, and the second dummy patterns. At step S12, a rule file is retrieved, and a check is made as to whether the minimum interval between each of the smallest imaginary dummy patterns and either one of the wires, the first dummy patterns, and the second dummy patterns is proper. If it is proper, the smallest imaginary dummy patterns remain at step S13. If there are imaginary dummy patterns that are not proper, the smallest imaginary dummy patterns that are not proper are selected and removed at step S14. After these steps, the arrangement of the third dummy pattern set is fixed at step S15.

At step S16, the wires, the first dummy patterns, the second dummy patterns, and the third dummy patterns are combined together, thereby generating mask data for use in the resist exposure process.

In the sixth embodiment described above, the dummy patterns having three different sizes are used. Alternatively, dummy patterns having two different sizes or four or more different sizes may be used.

In the following, a seventh embodiment of the present invention will be described.

Figure 12A:
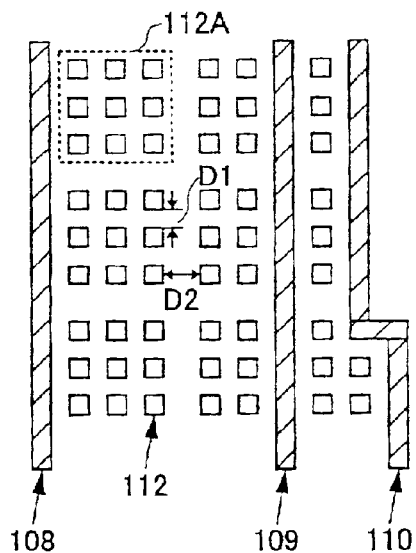
FIGS. 12A through 12C are drawings for explaining a method of arranging dummy patterns and a semiconductor integrated circuit according to a seventh embodiment of the present invention.
Figure 12B:
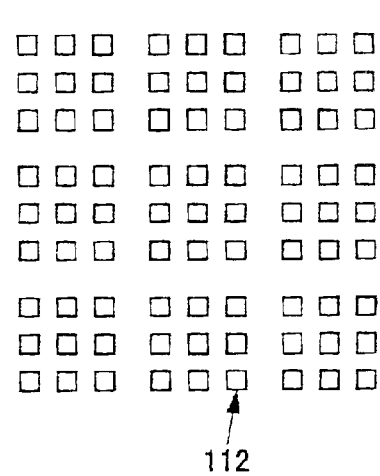
Figure 12C:
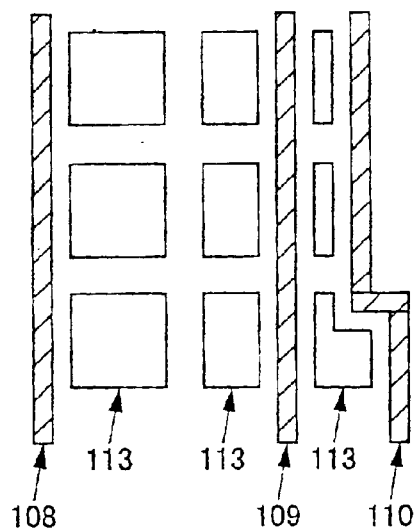

FIGS. 12A through 12C are drawings for explaining a method of arranging dummy patterns and a semiconductor integrated circuit according to a seventh embodiment of the present invention. As shown in FIG. 12A, the wire layout includes a first wire 108, a second wire 109, and a third wire 110. The wires 108 through 110 are situated in the same layer.

As shown in FIG. 12A, dummy patterns 112 are generated at a first step. A plurality of the dummy patterns 112 forms a group 112A. The dummy patterns 112 are arranged at two different intervals such that the dummy patterns are provided at a first interval D1 within the group 112A and at a second interval D2 that is a dummy pattern interval between the groups. The size of the dummy patterns 112 is 1 $\mu$m, for example. The interval D1 of the dummy patterns 112 is 0.8 $\mu$m, for example, and the interval D2 is 1 $\mu$m, for example.

FIG. 12B shows a template of the dummy patterns 112 according to the seventh embodiment of the present invention. This template is superimposed on the wire layout of FIG. 12A, and the dummy patterns 112 that interfere with the wires are removed, resulting in the arrangement of dummy patterns as shown in FIG. 12A. In this example, 9 dummy patterns are arranged in a 3×3 matrix at intervals of 0.8 $\mu$m to form a group 112A, and the intervals between the groups are 1 $\mu$m.

FIG. 12C shows the generation of dummy patterns at a second step according to the seventh embodiment. In FIG. 12C, dummy patterns 113 are generated by combining together the dummy patterns 112 of FIG. 12A. The combining of the dummy patterns 112 is performed as follows.

First, the dummy patterns 112 are expanded by 0.44 $\mu$m in all four directions, i.e., upward, downward, to the left, and to the right. That is, a 1-$\mu$m dummy size is expanded to a 1.88-$\mu$m dummy size. The dummy patterns arranged at 0.8-$\mu$m intervals overlap each other, filling the gaps therebetween. Since the dummy patterns arranged at 1-$\mu$m intervals that are intervals between the groups 112A still have 0.12-$\mu$m gaps therebetween, these dummy patterns do not overlap, and are not combined together.

Then, the expanded and combined dummy patterns are shrunk by 0.44 $\mu$m in all the four directions, i.e., upward, downward, to the left, and to the right. As a result, the 0.12-$\mu$m intervals that are intervals between the groups 112A are returned to 1 $\mu$m, thereby producing the dummy patterns 113 as shown in FIG. 12C.

In the seventh embodiment as described above, the dummy patterns having only a single size are used, and are arranged at different intervals. The narrower intervals are filled by expanded dummy patterns, so that the dummy patterns are combined together. This increases the dummy size, thereby increasing the area occupancy ratio. Even if the dummy size of the template is set to a relatively small size, the combining process can compensate for the relatively small size, so that it is possible to use small-sized dummy patterns that can be suitably arranged in narrow areas.

Figure 13:
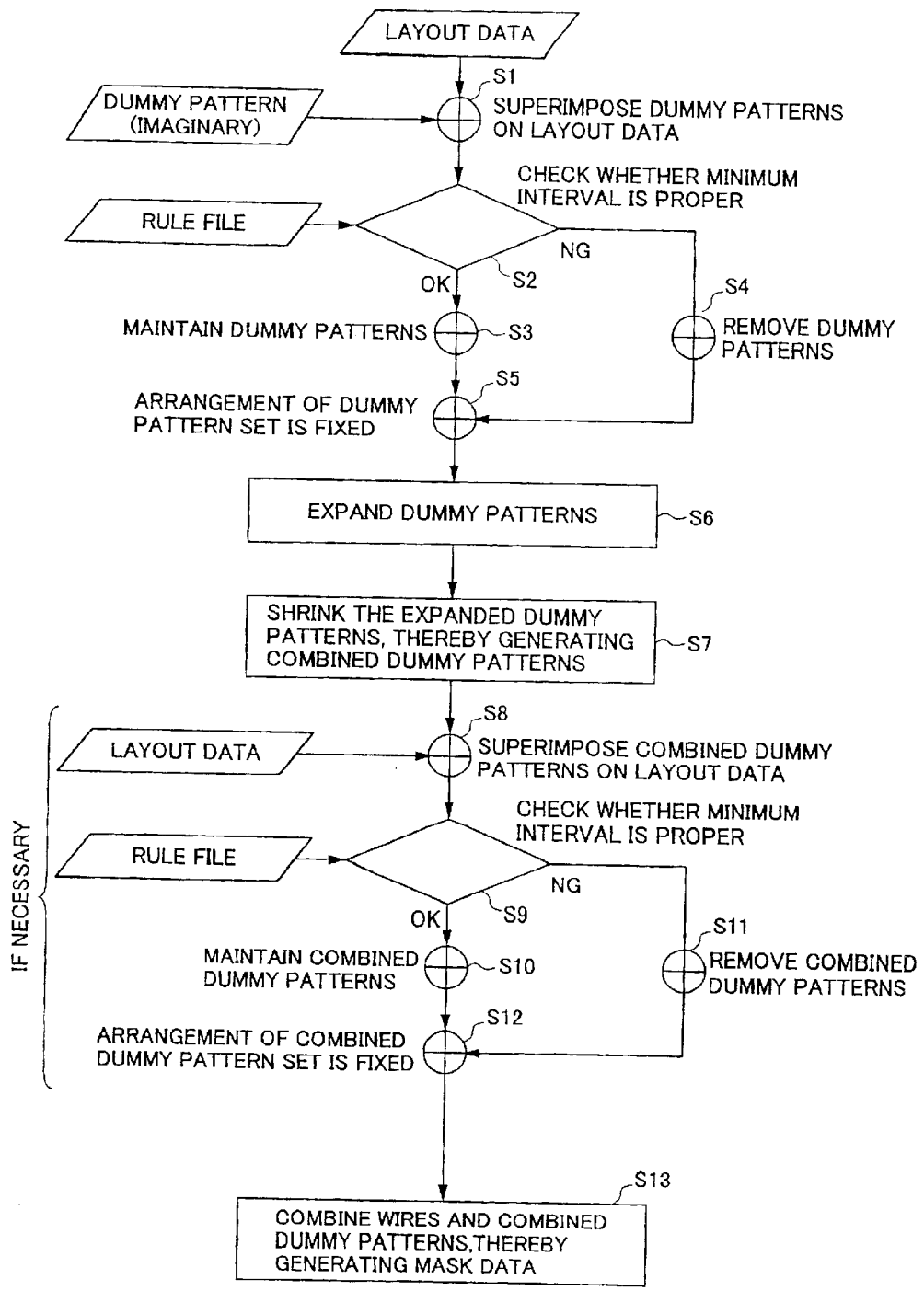
FIG. 13 is a flowchart of a method of arranging dummy patterns according to the seventh embodiment of the present invention.

FIG. 13 is a flowchart of a method of arranging dummy patterns according to the seventh embodiment of the present invention.

At step S1, data of dummy patterns and data of layouts are retrieved, and the dummy patterns are superimposed on the layout data. At step S2, a rule file is retrieved, and a check is made as to whether the minimum interval between each of the dummy patterns and wires is proper. If it is proper, the dummy patterns remain at step S3. If there are dummy patterns that are not proper, the dummy patterns that are not proper are selected and removed at step S4. At step S5, the arrangement of the dummy pattern set is fixed. At step S6, the dummy patterns are expanded. At step S7, the expanded dummy patterns are shrunk, which produces combined dummy patterns.

The procedure described above generates the combined dummy patterns. The following procedure may further be performed if necessary. At step S8, layout data is retrieved, and the layout data is superimposed on the dummy patterns. At step S9, a rule file is retrieved, and a check is made as to whether the minimum interval between each of the combined dummy patterns and the wires is proper. If it is proper, the combined dummy patterns remain at step S10. If there are combined dummy patterns that are not proper, the combined dummy patterns that are not proper are removed at step S11. At step S12, the arrangement of the combined dummy pattern set is fixed.

At step S13, the wires and the combined dummy patterns are combined together, thereby generating mask data for use in the resist exposure process.

In the seventh embodiment described above, a method of generating the dummy patterns of FIG. 12C through a combining process has been described. Alternatively, dummy patterns of the same kind may be generated without employing the combining process as described above. For example, the combined dummy patterns having a square shape shown in FIG. 12C are arranged in rows and columns at constant intervals to make a template, and, this template is superimposed on wire patterns, followed by cutting off portions of the square dummy patterns that overlap the wire patterns. In this manner, the seventh embodiment is not limited to a particular method for implementation, but includes a semiconductor integrated circuit which is provided with dummy patterns having varying shapes in conformity to the wire patterns.

In the following, an eighth embodiment of the present invention will be described. In the previous embodiments, methods that refrain from generating dummy patterns above and below circuit wire patterns end up having almost no dummy patterns in layers above and below the circuit wire patterns if the circuit wire patterns are densely arranged. This results in a failure to increase the area ratio of resist patterns and a failure to achieve a constant area ratio for resist patterns. The eighth embodiment of the present invention provides a solution to this problem.

Figure 14A:
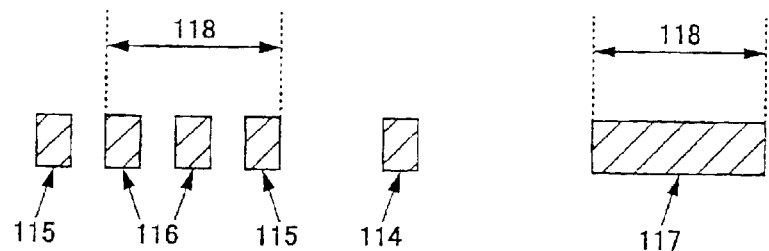
FIGS. 14A and 14B are cross-sectional views of an LSI that shows an area where dummy patterns are permitted according to the eighth embodiment of the present invention.
Figure 14B:
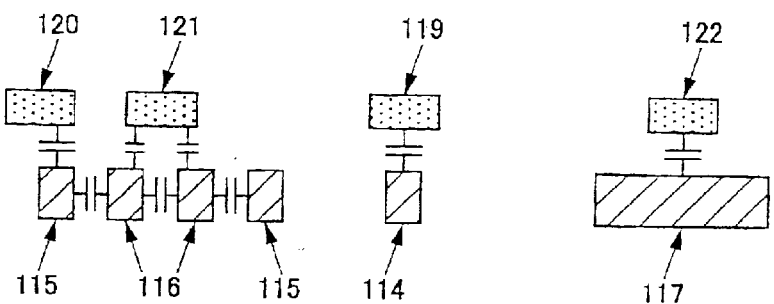

FIGS. 14A and 14B are cross-sectional views of an LSI that shows an area where dummy patterns are permitted according to the eighth embodiment of the present invention. In FIG. 14A, a wiring layer of concern includes a wire 114 having adjacent grids vacant on both sides, and includes a wire 115 having an adjacent grid vacant on one side thereof. Wires 116 have adjacent grids filled on both sides in the wiring layer of concern. A wire 117 is a thick wire provided in the wiring layer of concern. Here, "grids" are an imaginary structure that shows positions where wires are arranged at the time of designing semiconductor integrated circuits, and grid intervals define minimum intervals between wires.

With respect to the wire patterns of the wiring layer of concern, dummy pattern permitted areas 118 are calculated. In the layers above or below the layer of concern, dummy patterns are permitted and arranged in areas that overlap the dummy pattern permitted areas 118. The width of the wires 114, 115, and 116 is 0.5 $\mu$m, for example, and the width of the wire 117 is 2.5 $\mu$m, for example. The grid pitch is 1 $\mu$m, for example. With respect to the areas of wires having the width thereof wider than 2 $\mu$m, dummy patterns are permitted in the layers above and below the layer of concern. In addition, dummy patterns are permitted in the layers above and below the layer of concern with respect to the areas of the wires 116 having adjacent grids filled on both sides thereof, whereas dummy patterns are not permitted in the layers above and below the layer of concern with respect to the areas of the wire 114 having adjacent grids vacant on both sides thereof and the wire 115 having adjacent grids vacant on one side thereof. The description provided here is directed to an attribute of a single wiring layer. The actual generation of dummy patterns is determined by making an assessment based on Boolean multiplication operation of the dummy pattern permitted areas 118 and the areas of no wires in the layer in which dummy patterns are to be generated. Here, the dummy pattern permitted areas 118 are attributes associated with the layers above and below the layer of concern.

FIG. 14B illustrates coupling through parasitic capacitance in a case in which imaginary dummy patterns are provided in the layer atop the layer of concern shown in FIG. 14A. A dummy pattern 119 is arranged over the wire 114 having adjacent grids vacant on both sides thereof. A dummy pattern 120 is situated over the wire 115 having adjacent grids vacant on one side thereof. A dummy pattern 121 is situated over the wires 116 having adjacent grids filled on both sides thereof. A dummy pattern 122 is provided over the thick width wire 117.

Parasitic capacitances between the wires and the dummy patterns of the upper layer are illustrated in the figure by using a generally used capacitor symbol. The relative size of a parasitic capacitance is represented by the length of its capacitor symbol. Although the dummy pattern 112 for the thick width wire 117 has the largest parasitic capacitance, this capacitance does not pose a problem since the wire 117 is supposed to be a power supply line or a ground line. The dummy pattern 119 for the wire 114 having adjacent grids vacant on both sides thereof has a relatively large parasitic capacitance. In this embodiment, therefore, the generation of dummy patterns is prohibited in the layers above and below such wire.

The dummy pattern 120 for the wire 115 having adjacent grids vacant on one side thereof has a medium parasitic capacitance. In this embodiment, the generation of dummy patterns is prohibited in the layers above and below such wire. Since the dummy pattern 121 for the wires 116 having the adjacent grids filled on both sides thereof has a small parasitic capacitance, the generation of dummy patterns is permitted in the layers above and below such wires. The reason why the dummy pattern 121 has a small parasitic capacitance with respect to the wires 116 is that when wires are present in the adjacent grids on both sides, parasitic capacitances coupled to the adjacent wires become predominant, and the parasitic capacitance coupled to the dummy pattern 121 is relatively insignificant. As a result, the effect of the parasitic capacitance can be ignored in relative terms, so that the generation of dummy patterns is permitted in the layers above and below the wires.

Figure 15:
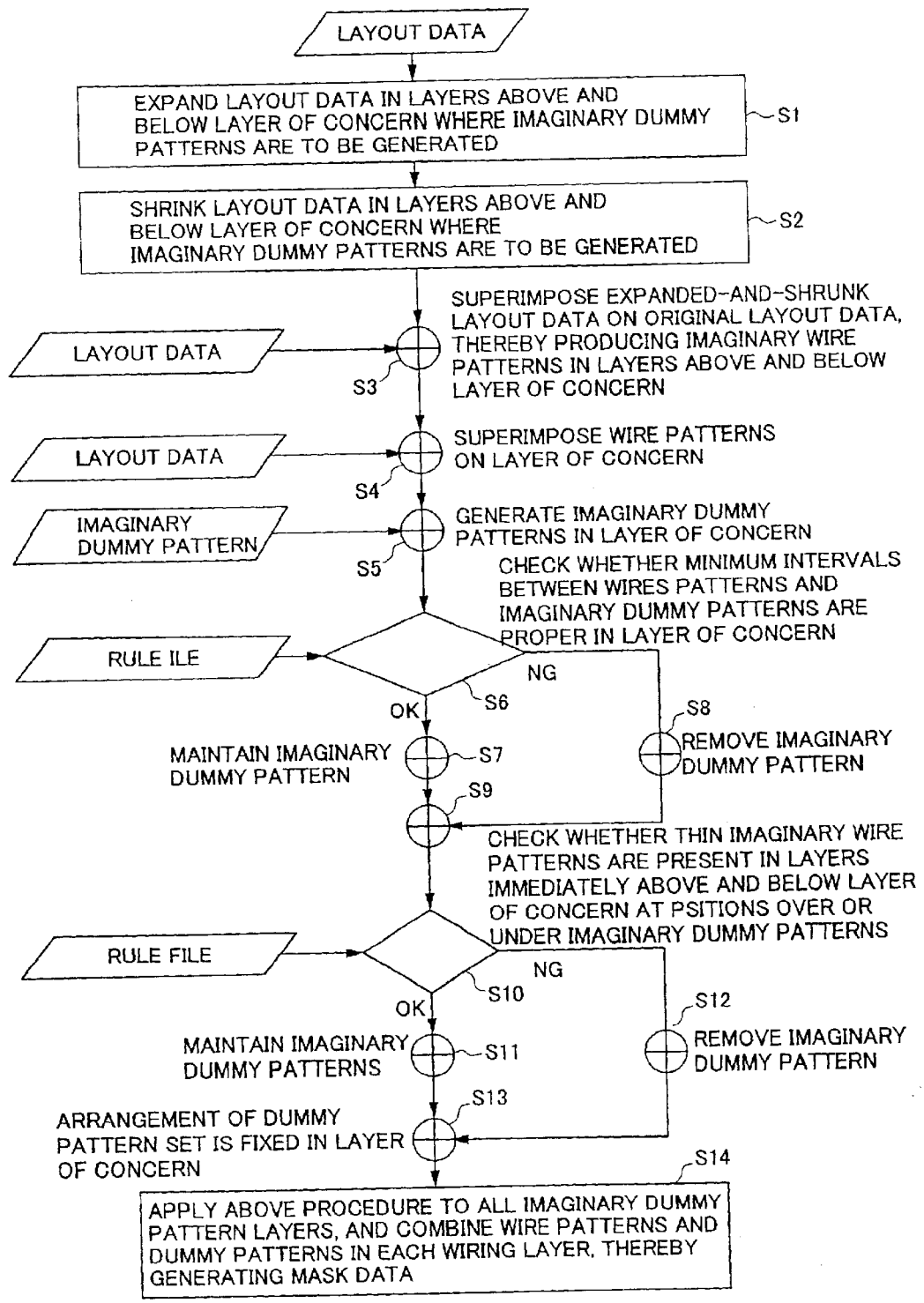
FIG. 15 is a flowchart of a method of arranging dummy patterns according to the eighth embodiment of the present invention.

FIG. 15 is a flowchart of a method of arranging dummy patterns according to the eighth embodiment of the present invention. FIG. 16 through FIG. 21 show plan views of a layout at each stage of the method of arranging dummy patterns according to the eighth embodiment. In the following, the method of arranging dummy patterns shown in FIG. 15 will be described with reference to FIG. 16 through FIG. 21.

Figure 16:
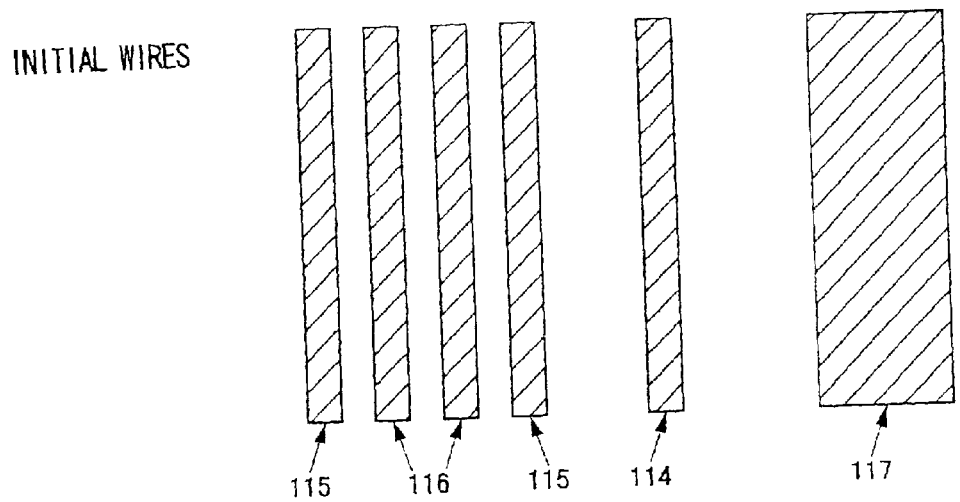
FIG. 16 is a plan view of a layout at one stage of the method of arranging dummy patterns according to the eighth embodiment.

FIG. 16 shows an initial wire pattern. In FIG. 16, the same wires as those of FIGS. 14A and 14B are referred to by the same numerals.

Figure 17:
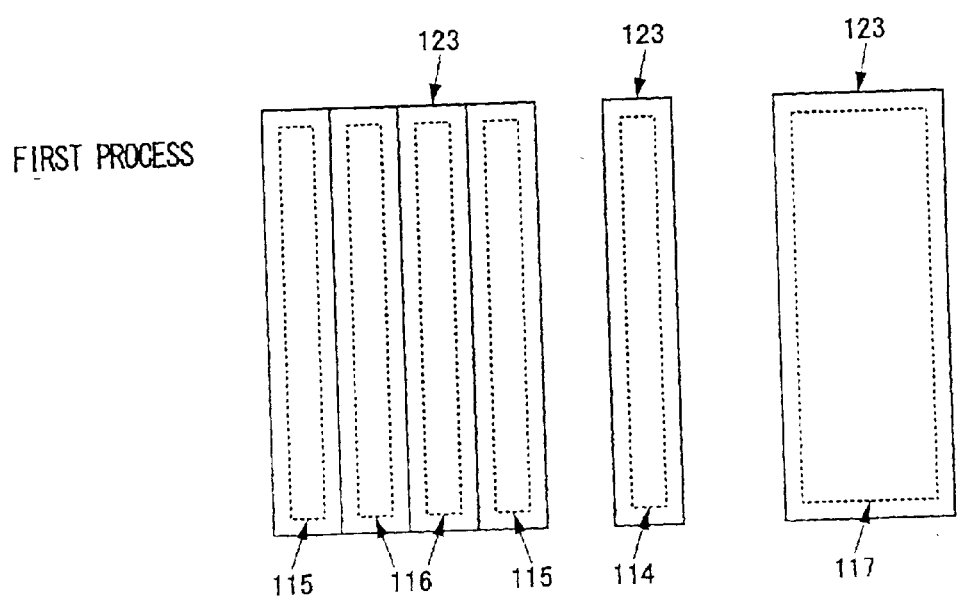
FIG. 17 is a plan view of the layout at one stage of the method of arranging dummy patterns according to the eighth embodiment.

With reference to FIG. 15, at step S1 for a first process, layout data is retrieved, and the wires 114 through 117 are expanded. This expansion is made to such an extent that wires having adjacent grids filled on both sides overlap each other by filling the gaps therebetween. The expansion, however, should not allow wires to overlap each other by filling the gaps if the wires are second next to each other with a vacant grid therebetween. FIG. 17 shows expanded wires 123. The wires 114 through 117 as initially provided are shown by dotted lines.

Figure 18:
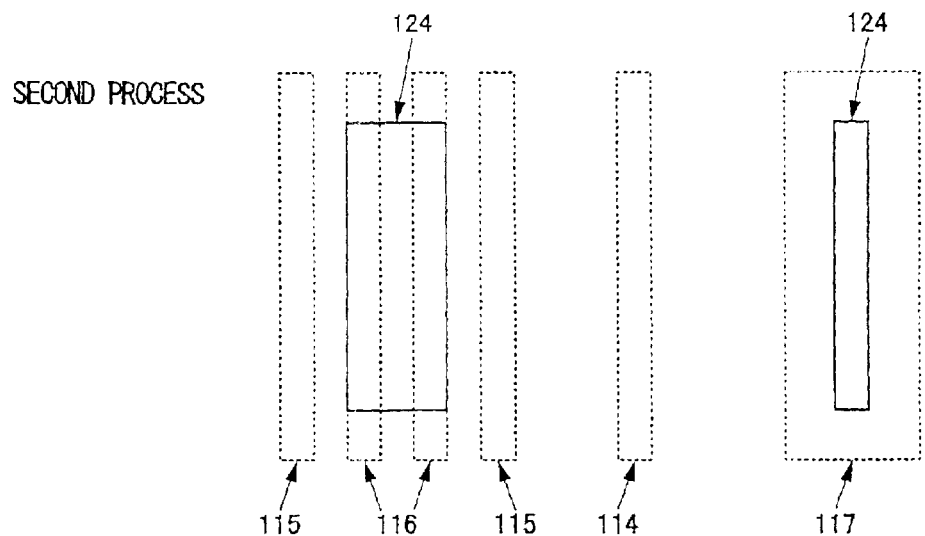
FIG. 18 is a plan view of the layout at one stage of the method of arranging dummy patterns according to the eighth embodiment.

At step S2 for a second process, the expanded wire patterns 123 are shrunk. As shown in FIG. 18, the extent to which the wire patterns are shrunk is such that a shrunk wire pattern 124 does not remain at the position of the wire 115 having an adjacent grid vacant on one side thereof, but remains at the position of the wires 116 having adjacent grids filled on both sides thereof.

Figure 19:
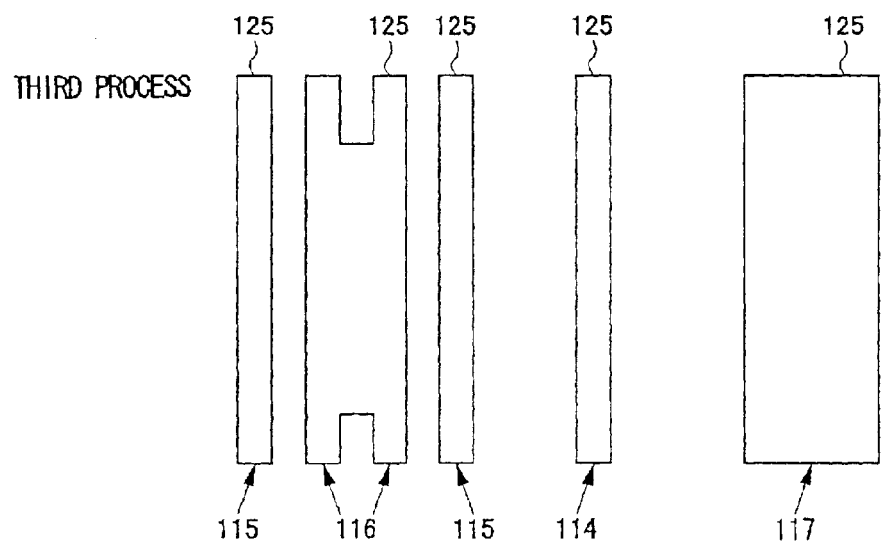
FIG. 19 is a plan view of the layout at one stage of the method of arranging dummy patterns according to the eighth embodiment.

At step S3 for a third process, layout data is retrieved, and a Boolean addition operation is performed between the shrunk wire patterns 124 and the original wires 114 through 117, thereby producing wire patterns 125. FIG. 19 shows the wire patterns 125 obtained after the Boolean addition operation.

At step S4, layout data is retrieved, and wire patterns that belong to the layer of concern in which the dummy patterns are to be generated are laid out in this layer of concern. At step S5, data of dummy patterns is retrieved to generate the dummy patterns that belong to the layer of concern in which the dummy patterns are to be generated. At step S6, a rule file is retrieved, and a check is made as to whether the minimum intervals between the wires and the dummy patterns are proper in the layer of concern. If they are proper, the dummy patterns remain at step S7. If there are dummy patterns that are not proper, the dummy patterns that are not proper are removed at step S8. At step S9, as a result of the above steps, the arrangement of the dummy pattern set is fixed while taking into account the wires in the layer of concern.

After this, the wire patterns 125 obtained by the Boolean addition operation are used, as will be described in the following, in order to generate dummy patterns that reflect wire patterns of the layers immediately above and below the layer of concern.

At step S10, a rule file is retrieved, and a check is made whether thin wire patterns are present in the layers immediately above and below the layer of concern at positions over or under the dummy patterns of the layer of concern. In doing so, the wire patterns 125 obtained after the Boolean addition operation are used as the wire patterns of the layers immediately above and below the layer of concern. If there is no thin wire pattern, the dummy patterns remain at step S11. If there are thin wire patterns, the dummy patterns corresponding to the thin wire patterns are removed at step S12. At step S13, as a result of all the above steps, the arrangement of the dummy pattern set is fixed by taking into account the wires in the layers above and below the layer of concern.

Figure 20:
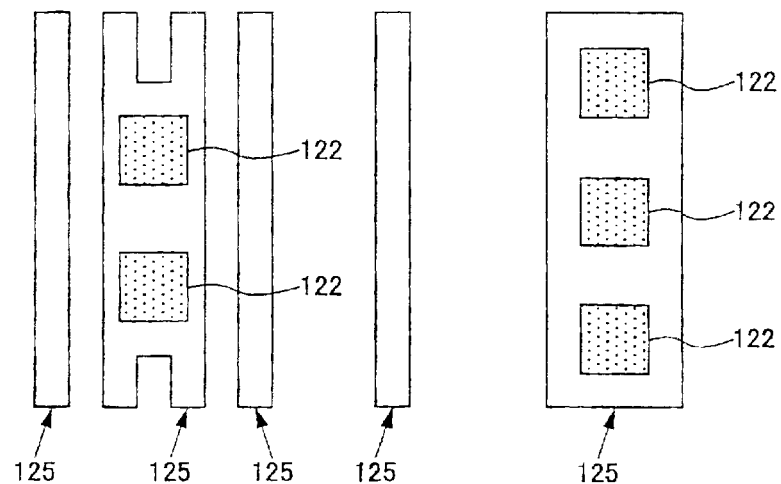
FIG. 20 is a plan view of the layout at one stage of the method of arranging dummy patterns according to the eighth embodiment.
Figure 21:
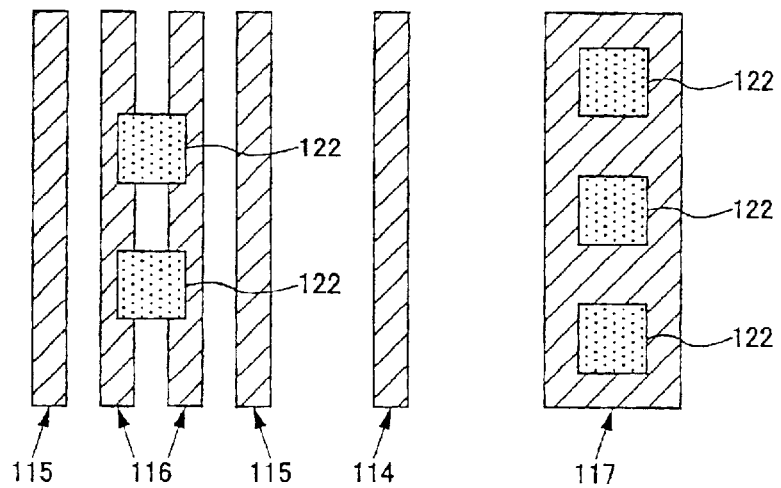
FIG. 21 is a plan view of the layout at one stage of the method of arranging dummy patterns according to the eighth embodiment.

The steps S10 through S13 described above correspond to the fourth process. As shown in FIG. 20, the generation of dummy patterns 122 in the layer of concern is permitted at the positions of the thick wires such as the wires having a width of 1 μm or more, thereby generating a finalized form of dummy patterns 122 as shown in FIG. 20. After this, as the fifth process, the wire patterns 125 obtained after the Boolean addition operation are replaced by the original wires 114 through 117, thereby finalizing the layout form. FIG. 21 shows the finalized form of the dummy patterns 122 provided in the layer of concern and the wire patterns 114 through 117 provided in the layer therebelow.

At step S14, after the above procedure is applied to all the dummy pattern layers, wire patterns and dummy patterns are combined in each wiring layer, thereby generating mask data for use in the exposure process.

In FIG. 16 through FIG. 21, for the sake of simplicity of explanation, only a single wiring layer has been taken into consideration, and a description has been given only with respect to a case in which the dummy patterns are generated in the layer above this single wiring layer. In the actual layout, dummy patterns should be generated by taking into account a Boolean multiplication operation of all the dummy pattern permitted areas, i.e., by taking into account a Boolean addition operation of the wire layout of the layer of concern, the dummy pattern prohibited areas projected from one layer below, and the dummy pattern prohibited areas projected from one layer above.

In the eighth embodiment described above, the areas over and under the wire 114 having adjacent grids vacant on both sides thereof are treated as dummy pattern prohibited areas, and so are the areas over and under the wire 115 having an adjacent grid vacant on one side thereof. Alternatively, if the effect of parasitic capacitance is small, the areas over and under the wire 115 having an adjacent grid vacant on one side thereof may be treated as dummy pattern permitted areas.

In the following, a ninth embodiment of the present invention will be described. In the embodiments described above, when the generation of wire dummy patterns is permitted over and under wide width wires, dummy patterns are generated over and under the wires that have a wide width but have varying signal levels. Such wires include the trunk of a clock wire tree. In such a case, parasitic capacitance may cause a delay. The ninth embodiment of the present invention provides a solution to this problem.

Figure 22:
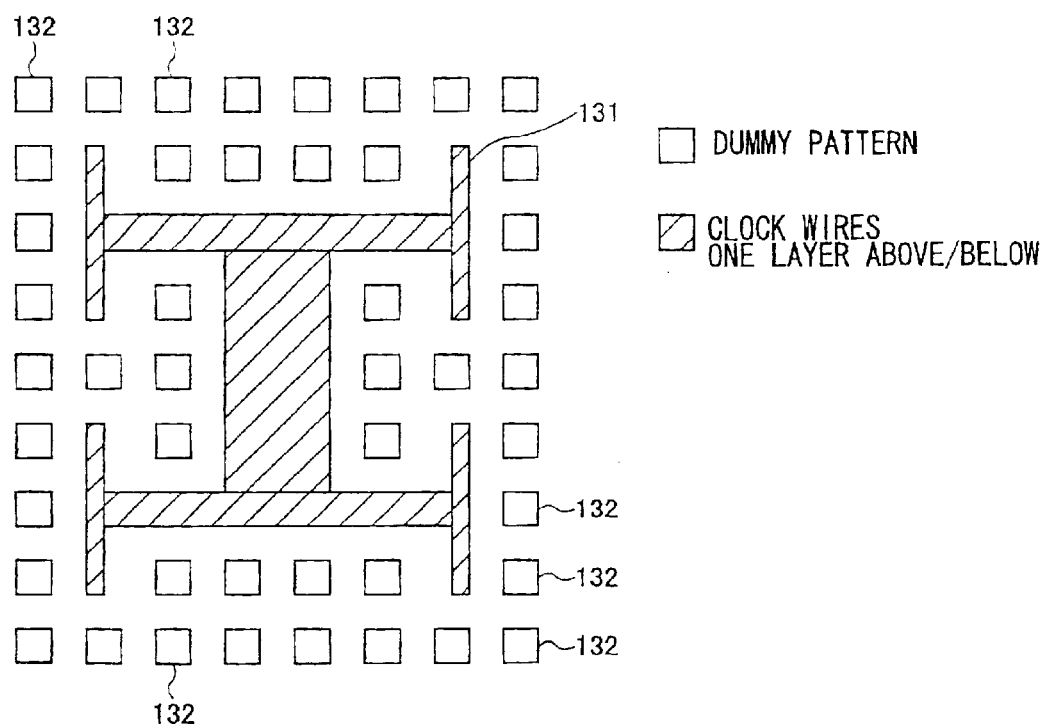
FIG. 22 is a drawing for explaining a method of arranging dummy patterns and a semiconductor integrated circuit according to a ninth embodiment of the present invention.

FIG. 22 is a drawing for explaining a method of arranging dummy patterns and a semiconductor integrated circuit according to the ninth embodiment of the present invention.

In the ninth embodiment, the generation of dummy patterns is prohibited over and under a clock tree. In FIG. 22, a clock tree wire pattern 131 is laid out, and dummy patterns 132 are provided one layer above. In the actual chip layout, a tree is formed by utilizing a plurality of wire layers. In FIG. 22, only two wire layers are shown for the sake of clarity of illustration. As shown in FIG. 22, the generation of the dummy patterns 132 is prohibited one layer above and one layer below at the position of the clock tree wire pattern 131.

Figure 23:
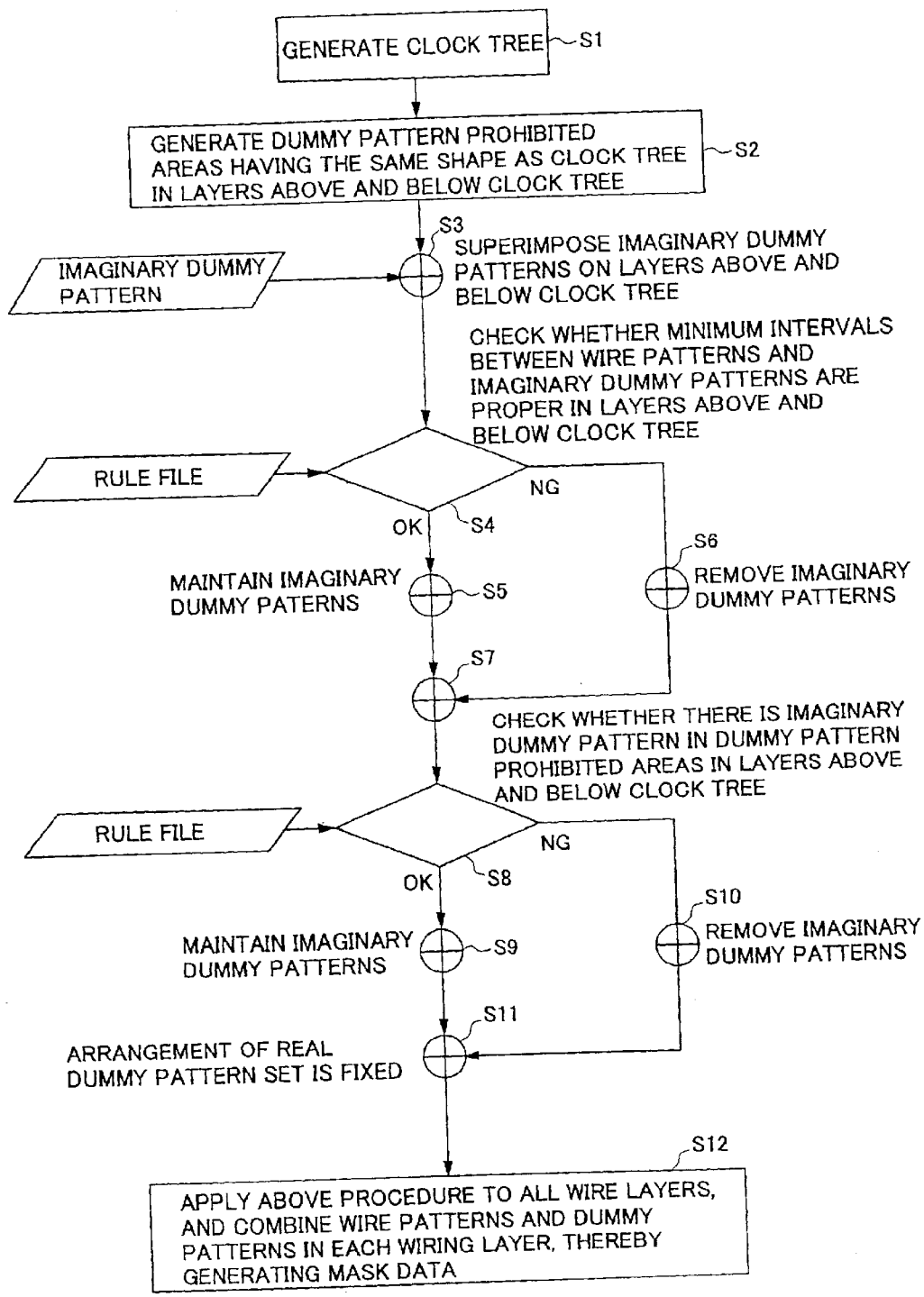
FIG. 23 is a flowchart of a method of arranging dummy patterns according to the ninth embodiment of the present invention.

FIG. 23 is a flowchart of a method of arranging dummy patterns according to the ninth embodiment of the present invention.

At step S1, a clock tree is generated. At step S2, dummy pattern prohibited areas having the same shape as the clock tree are generated in the layers above and below the clock tree. When a clock tree layout is generated, a CAD system generally generates only level codes for real circuit wires. In this embodiment, however, the patterns having the same shape as the clock tree are generated, and are given a level code for a dummy pattern prohibited area.

At step S3, dummy patterns are retrieved, and are superimposed on wire patterns in the layers above and below the clock tree. At step S4, a rule file is retrieved, and a check is made as to whether the minimum intervals between the wire patterns and the dummy patterns are proper in the layers above and below the clock tree. If they are proper, the dummy patterns remain at step S5. If there are dummy patterns that are not proper, the dummy patterns that are not proper are removed at step S6. At step S7, as a result of the above steps, the arrangement of the dummy pattern set is fixed while taking into account the wires in the layers above and below the clock tree.

At step S8, a check is made as to whether there is a dummy pattern in the dummy pattern prohibited areas generated at the step S1 in the layers above and below the clock tree. If no dummy pattern is so positioned, the dummy patterns remain at step S9. If a dummy pattern is positioned in the dummy pattern prohibited areas, such dummy pattern is removed at step S10. At step S1, as a result of all the above steps, the arrangement of the dummy pattern set is fixed while taking into account the dummy pattern prohibited areas in the layers above and below the clock tree.

At step S12, after the above procedure is applied to all the wire layers, wire patterns and dummy patterns are combined in each wiring layer, thereby generating mask data for use in the exposure process.

FIG. 24 is a CAD system that performs the method of arranging dummy patterns according to the present invention.

As shown in FIG. 24, an apparatus or CAD system for practicing the method of arranging dummy patterns according to the present invention is implemented as a computer such as a personal computer or an engineering workstation. The apparatus of FIG. 24 includes a computer 510, a display device 520 connected to the computer 510, a communication device 523, and an input device. The input device includes a keyboard 521 and a mouse 522, for example. The computer 510 includes a CPU 511, a RAM 512, a ROM 513, a secondary storage device 514 such as a hard drive, an exchangeable-medium storage device 515, and an interface 516.

The keyboard 521 and the mouse 522 provide interface to communicate with user, and receive various commands for operating the computer 510, user responses responding to the computer, etc. The display device 520 displays data or the like processed by the computer 510, and also displays various data that enables user to communicate with the computer for the purpose of operating the computer 510. The communication device 523 is used to communicate with a remote site, and includes a modem, a network interface, or the like.

CAD software including the method of arranging dummy patterns according to the present invention is provided as a computer program executable by the computer 510. This computer program is stored in a memory medium M that is inserted into the exchangeable-medium storage device 515, and is loaded to the RAM 512 or the secondary storage device 514 from the memory medium M through the exchangeable-medium storage device 515. Alternatively, this computer program is stored in a memory medium (not shown) located at a remote site, and is loaded to the RAM 512 or the secondary storage device 514 from this memory medium through the communication device 523 and the interface 516.

Upon receiving a user instruction for program execution through the keyboard 521 and/or the mouse 522, the CPU 511 loads the program to the RAM 512 from the memory medium M, the remote memory medium, or the secondary storage device 514. The CPU 511 executes the program loaded to the RAM 512 by using the free space of the RAM 512 as a work area, and carries out the process while interacting with the user as necessary. The ROM 513 stores control programs for controlling the basic operations of the computer 510.

The methods of arranging dummy patterns as described in connection with the above embodiments are practiced by executing the computer program. This computer environment is a CAD system.

Further, the present invention is not limited to these embodiments, but various variations and modifications may be made without departing from the scope of the present invention.

The present application is based on Japanese priority application No. 2001-322814 filed on Oct. 19, 2001, with the Japanese Patent Office, the entire contents of which are hereby incorporated by reference.

What is claimed is:

1. A semiconductor integrated circuit, comprising:
   a plurality of layers provided on a semiconductor substrate;
   wires provided in a first layer that is one of said plurality of layers, said wires excluding those having a wire width wider than a predetermined wire width; and
   wire dummies provided in a second layer different from the first layer by avoiding areas that are directly above or below positions of said wires provided in said first layer.

2. The semiconductor integrated circuit as claimed in claim 1, wherein the first layer is a layer immediately above or immediately below the second layer.

3. The semiconductor integrated circuit as claimed in claim 1, wherein said wires are signal wires excluding power supply wires.

4. A semiconductor integrated circuit, comprising:
   a plurality of layers provided on a semiconductor substrate;
   signal wires and power supply lines are provided in a first layer that is one of said plurality of layers; and
   wire dummies provided in a second layer different from the first layer and having an arrangement that avoids areas overlapping positions of said signal wires,
   wherein
   said wire dummies are further provided in areas overlapping positions of said power supply wires that are provided in the first layer.

5. A semiconductor integrated circuit, comprising:
   a plurality of layers provided on a semiconductor substrate;
   signal wires and power supply wires are provided in a first layer that is one of said plurality of layers; and
   wire dummies provided in a second layer different from the first layer and having an arrangement that avoids areas overlapping positions of said signal wires,
   wherein
   said wire dummies are further provided in areas overlapping positions of said power supply wires that are provided in the first layer, and
   said signal wires have a width less than a predetermined wire width, and said power supply wires have a width greater than the predetermined wire width.

6. The semiconductor integrated circuit as claimed in claim 1, wherein said wire dummies further avoid areas that are directly above positions of polysilicon or diffusion layers.

7. A semiconductor integrated circuit, comprising:
   a wire layer;
   wires provided in said wire layer; and
   square dummy patterns provided in said wire layer and having different sizes,
   wherein the size of one of said square dummy patterns that is arranged between two adjacent wires of said wires spaced apart from each other by a first distance is larger than the size of one of said dummy patterns that is arranged between two adjacent wires of said wires spaced apart from each other by a second distance that is shorter than the first distance.

8. A semiconductor integrated circuit, comprising:
   a plurality of wire layers stacked one over another;
   a plurality of wires including first wires and second wires and arranged in a first wire layer that is one of said wire layers, said plurality of wires being arranged at various intervals, a shortest of which is a predetermined interval, said first wires having wires on both sides thereof at a distance equal to said predetermined interval, and said second wires having no wires on both sides thereof at a distance equal to the predetermined interval; and
   dummy patterns provided in a second wire layer immediately above or below the first wire layer, said dummy patterns being arranged in areas overlapping positions of said first wires and being absent in areas overlapping positions of said second wires.

9. The semiconductor integrated circuit as claimed in claim 8, wherein said plurality of wires includes third wires having a wire only on one side thereof at a distance equal to the predetermined interval, and said dummy patterns are arranged in the second layer in areas overlapping positions of said third wires.

10. The semiconductor integrated circuit as claimed in claim 8, wherein said plurality of wires includes third wires having a wire only on one side thereof at a distance equal to the predetermined interval, and said dummy patterns are absent in the second layer in areas overlapping positions of said third wires.

11. A semiconductor integrated circuit, comprising:

a plurality of wire layers stacked one over another;

a plurality of wires including first wires, second wires, and third wires, and arranged in a first wire layer that is one of said wire layers, said first wires being narrower than a predetermined width, said second wires being equal to or wider than the predetermined width and carrying a power supply potential, and said third wires being equal to or wider than the predetermined width and carrying a clock signal; and dummy patterns provided in a second wire layer immediately above or below the first wire layer, said dummy patterns being arranged in areas overlapping positions of said second wires and being absent in areas overlapping positions of said third wires.

12. The semiconductor integrated circuit as claimed in claim 7, wherein said square dummy patterns having different sizes are arranged at respective different patter intervals.

* * * * *

UNITED STATES PATENT AND TRADEMARK OFFICE
CERTIFICATE OF CORRECTION

PATENT NO. : 6,815,811 B2
DATED : November 9, 2004
INVENTOR(S) : Hiroyuki Ozawa et al.

It is certified that error appears in the above-identified patent and that said Letters Patent is hereby corrected as shown below:

Column 17, line 54, to Column 18, line 3,
Please delete "Claims 1, 2 and 3."

Column 18,
Line 16, please insert the words after "layer" as following:
-- and thereby achieving constant wire density, reduced parasitic capacitance and reduced signal delay --
Line 32, please insert the words after "width" as following:
-- and thereby achieving constant wire density, reduced parasitic capacitance and reduced signal delay --

Column 18, from line 33 to line 36,
Please delete "Claim 6"
Line 48, please insert the words after "distance" as following:
-- and thereby achieving constant wire density, reduced parasitic capacitance and reduced signal delay --

Signed and Sealed this

Twenty-eighth Day of June, 2005

JON W. DUDAS
*Director of the United States Patent and Trademark Office*